(12) United States Patent
Takada et al.

(10) Patent No.: US 6,344,753 B1
(45) Date of Patent: Feb. 5, 2002

(54) TEST SOCKET HAVING IMPROVED CONTACT TERMINALS, AND METHOD OF FORMING CONTACT TERMINALS OF THE TEST SOCKET

(75) Inventors: Shigeru Takada; Yasushi Tokumo; Shigeki Maekawa, all of Tokyo; Keiko Kaneko, Kumamoto, all of (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/480,945

(22) Filed: Jan. 11, 2000

(30) Foreign Application Priority Data

Jun. 18, 1999 (JP) .............................. 11-173421

(51) Int. Cl.⁷ ............................................... G01R 31/02
(52) U.S. Cl. ......................... 324/755; 324/754; 439/72
(58) Field of Search ................................ 324/755, 754, 324/756, 757, 72.5; 439/70, 72

(56) References Cited

U.S. PATENT DOCUMENTS 5,170,117 A * 12/1992 Chio .......................... 324/755
5,230,632 A   7/1993  Baumberger et al. ......... 439/66
5,699,612 A * 12/1997 Inoue et al. .................. 29/843
5,936,418 A *  8/1999 Ideta et al. ................. 324/755
6,208,155 B1 *  3/2001 Barabi et al. ................ 324/754

FOREIGN PATENT DOCUMENTS

JP        58-199545        11/1983
JP         8-306749        11/1996

* cited by examiner

Primary Examiner—Safet Metjahic
Assistant Examiner—Vincent Q. Nguyen
(74) Attorney, Agent, or Firm—McDermott, Will & Emery

(57) ABSTRACT

On each of the contact terminals of a test socket, one or more contact projections having a radius of curvature within a specified range, such as 0.03 to 0.3 mm, are formed in the portion of the contact terminals which contacts the corresponding external connection terminal of an electronic device. Further, a plurality of protuberances and recesses are formed on the surface of the contact projection, and each of the protuberances is formed to assume a substantially spherical surface having a radius of curvature of 2 to 15 microns. The test socket is for use in testing an electrical characteristics of an electronic device or a semiconductor package, and stable electrical contact is ensured between contact terminals of the test socket and external connection terminals of an electronic device or a semiconductor package.

8 Claims, 8 Drawing Sheets

PRIOR ART

FIG. 10

PRIOR ART

FIG. 11A

PRIOR ART

FIG. 11B

TEST SOCKET HAVING IMPROVED CONTACT TERMINALS, AND METHOD OF FORMING CONTACT TERMINALS OF THE TEST SOCKET

BACKGROUND OF THE INVENTION

1. Field of the Invention

The present invention relates to a test socket capable of continuously and stably measuring the electric characteristics of an electronic device or semiconductor package, as well as to a method of forming contact terminals, i.e. contacts or contact pins for measurement purposes, of the test socket.

2. Background Art

There will be described a method of establishing electrical contact between contact terminals (contacts) of a conventional test socket (a socket provided for measurement purpose) and external connection terminals of an integrated circuit (IC) or a semiconductor package, by reference to an example of a surface-mounted IC, e.g., a quad flat package (QFP).

Figure 10:
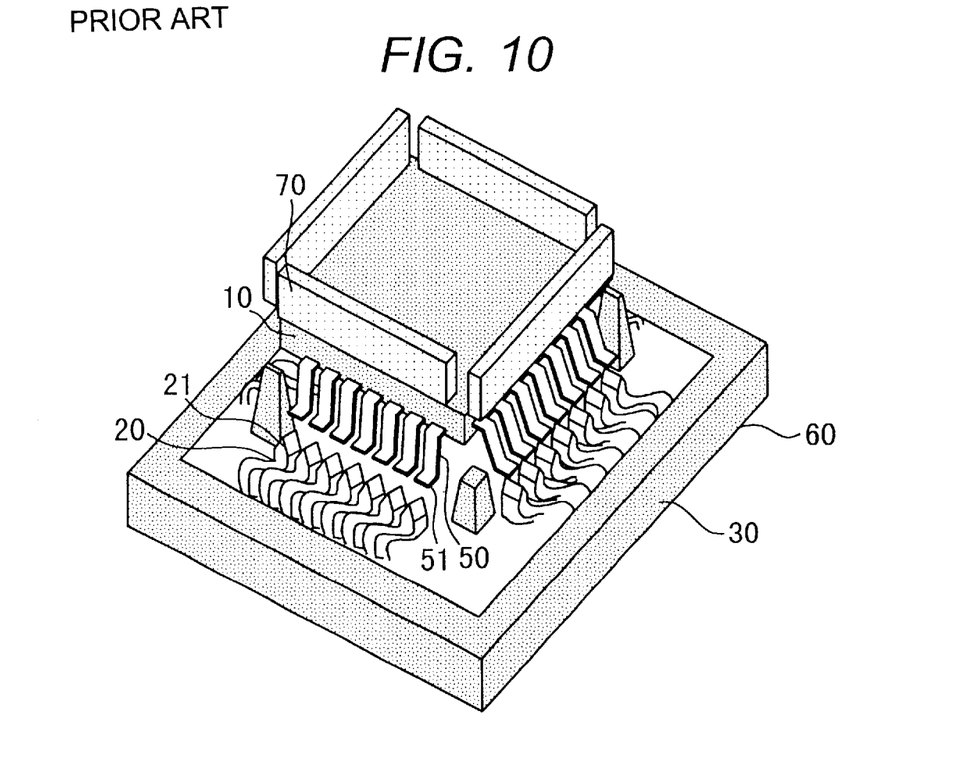
FIG. 10 is a perspective view showing an integrated circuit to be measured and a test socket having a plurality of contact terminals.

FIG. 10 is a perspective view showing an IC 10 to be measured and a test socket 60 having a plurality of contact terminals (contacts) 20. Contact terminals 20 of the test socket 60 are embedded in a housing 30 formed from an insulating member. External connection terminals 50 of the IC 10 are brought into pressing contact with contact planes 21 of the respective contact terminals 20.

Figure 11A:
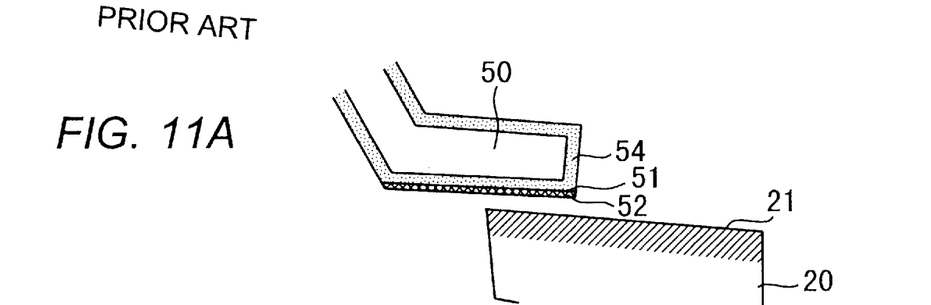
FIGS. 11A and 11B are enlarged cross-sectional views showing contact between one of the external connection terminals 50 and the contact plane 21 of the corresponding contact terminal 20.
Figure 11B:
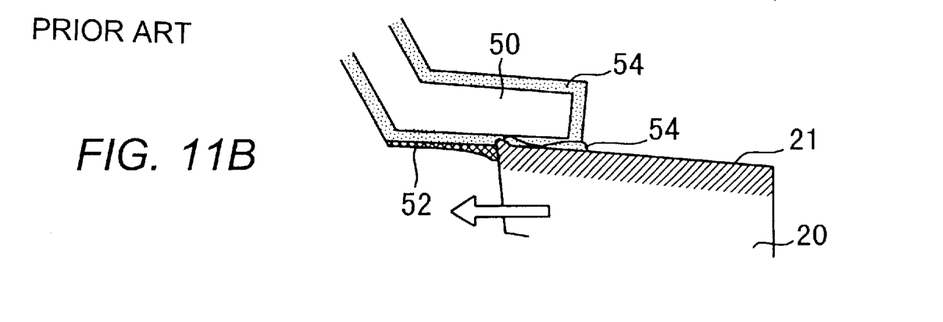

FIGS. 11A and 11B are enlarged cross-sectional views showing contact between one of the external connection terminals 50 and the contact plane 21 of the corresponding contact terminal 20. FIG. 11A is an enlarged view showing the contact plane 21 of the contact terminal 20 and a contact plane 51 of the external connection terminal 50, and FIG. 11B shows contact when the contact plane 51 is brought into pressing contact with the contact plane 21.

An oxide insulation film 52 (hereinafter referred to as an "oxide film," as needed) is present on the surface of the external connection terminal 50 of the IC 10 and possesses high electrical resistance. In order to ensure superior electrical contact, the contact surface 51 to be electrically connected must be brought into contact with the contact plane 21 by means of fracturing the oxide film 52. The external connection terminals 50 are further pressed to a certain degree while remaining in contact with the respective contact terminals 20, thus deflecting the contact terminals 20. As a result, relative slippage arises between the contact plane 21 of the contact terminal 20 and the contact plane 51 of the external connection terminal 50, thus removing the oxide film 52 and bringing the contact plane 51 into electrical contact with the contact plane 21.

Contact established by the foregoing conventional contact terminals (or contacts) suffers the following problem.

In association with fracture of the oxide film 52 of the external connection terminal 50, which results from relative slippage between the contact plane 21 of the contact terminal 20 and the contact plane 51 of the external connection terminal 50, a member 54 constituting the external connection terminal 50 (solder plating in this case) coagulates onto the contact surface 21 of the contact terminal 20. Greater relative slippage contributes to fracture of the oxide film 52 and enlargement of the contact area, thus effectively establishing superior electrical contact. However, the greater relative slippage also results in an increase in the amount of solder coagulating onto the contact plane 21. In most cases, the substance to coagulate corresponds to metal which oxidizes, such as solder. Through repetition of oxidation of the surface of the contact plane and deposition of the substance on the surface of the contact plane, contact resistance is increased, thereby preventing good electrical contact. More specifically, although relatively new contact terminals 20 establish good electrical contact, contact resistance is gradually increased with the number of times the contact terminals 20 are brought into contact with the contact planes of the external contact terminals 50 for measurement, thus rendering electrical contact difficult to achieve and shortening the life of the contact terminal 20.

Secondly, if superior electrical contact is not achieved, a non-defective IC may be determined to be defective, and the non-defective IC may be discarded.

Thirdly, if the percentage of ICs determined to be defective through erroneous determination exceeds a certain specified percentage, the group of ICs determined to be defective through erroneous determination is again subjected to determination, thus unnecessarily consuming time or incurring unnecessary costs.

Fourthly, the external connection terminals of the most current ICs tend to be arranged at narrower pitches. In association with this tendency, a contact failure is caused when foreign matter generated by an IC; for example, resin burrs or glass fillers contained in resin, is present between the contact terminal and the external connection terminal.

Japanese Patent Application Laid-Open No. Sho-58-199545 describes a measure for avoiding such a contact failure; i.e., a contact terminal whose tip end is formed into a plurality of sharp projections so as to establish contact by avoiding generation of foreign matter. However, since the projections of the contact terminal are sharp, the projections damage the external terminals, thus causing appearance or packaging failures.

SUMMARY OF THE INVENTION

The present invention has been conceived to solve the drawbacks of the conventional test socket, and the object of the present invention is to ensure stable contact between the external terminals of an electronic device and contact terminals of a test socket, thus realizing stable, continuous contact.

According to one aspect of the present invention, a test socket comprises contact terminals which are brought into electrical contact with external connection terminals of an electronic device or a semiconductor package, and each of the contact terminal has a plurality of protuberances and a plurality of recesses. The plurality of protuberances are formed from smooth curved surfaces in the portion of the contact terminals which contacts the corresponding external connection terminal, and the plurality of recesses are formed from smooth, curved surfaces adjacent to the respective protuberances.

According to another aspect of the present invention, a test socket comprises a plurality of contact terminals, and each of the contact terminals includes one or more contact projections provided on the surface thereof for contacting the external connection terminals of the electronic device or semiconductor package. The tip end of each of the contact projections being formed to assume a substantially spherical surface having a radius of curvature of 0.03 to 0.3 mm. Further, each of the contact projections has a plurality of minute protuberances and a plurality of minute recesses provided on the substantially spherical surface thereof formed from smooth curved surfaces.

According to still another aspect of the present invention, in a method of forming contact terminals of the test socket as stated above, the portion of each contact terminal, which contacts an external connection terminal of the electronic device or the semiconductor package, is machined to a desired surface roughness through electric-discharge machining. Then, the thus-roughened portion is plated with electrolytic nickel. Further, the thus nickel plated portion is plated with gold.

Other and further objects, features and advantages of the invention will appear more fully from the following description.

BRIEF DESCRIPTION OF THE DRAWINGS

FIGS. 8 and 9 are illustrations for describing the advantageous effect of the present invention, such as those described in connection with the previous embodiments.

DETAILED DESCRIPTION OF THE PREFERRED EMBODIMENTS

Preferred embodiments of the present invention will be described hereinbelow by reference to the accompanying drawings. Throughout the drawings, like reference numerals are assigned to like or corresponding elements, and repetition of their explanations is simplified or omitted for brevity.

First Embodiment

Figure 1:
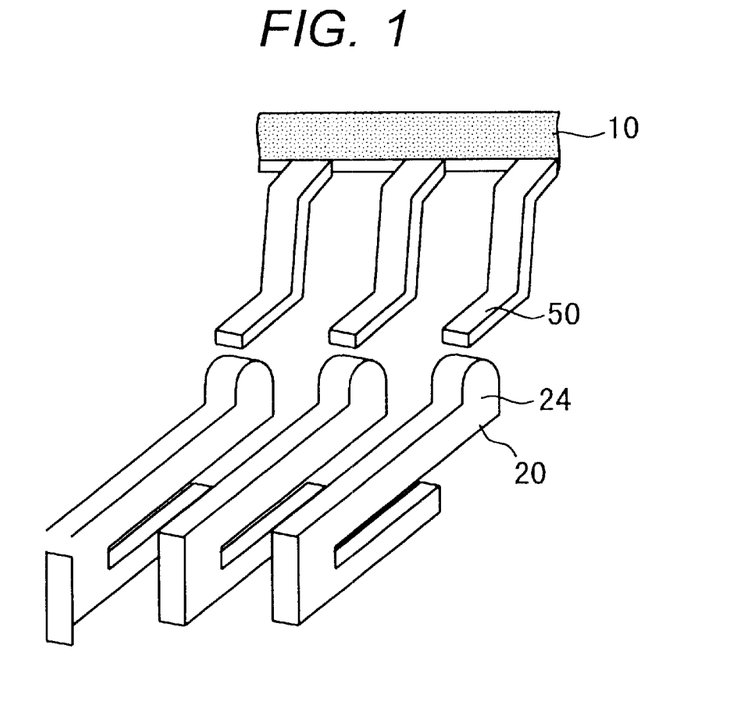
FIG. 1 is a perspective view showing a contact terminal of a test socket to be brought into contact with an external connection terminal of an electronic device.
Figure 2:
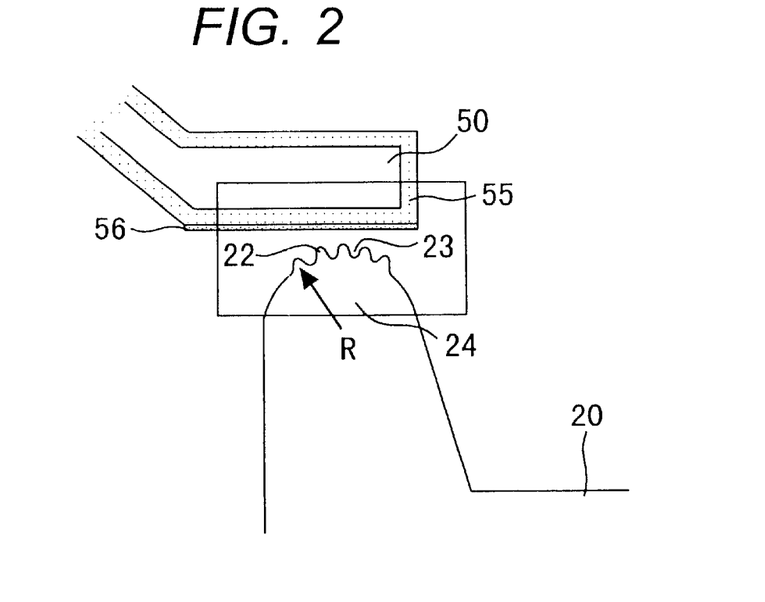
FIG. 2 is an enlarged side view showing contact between the contact terminal and the external connection terminal.
Figure 3A:
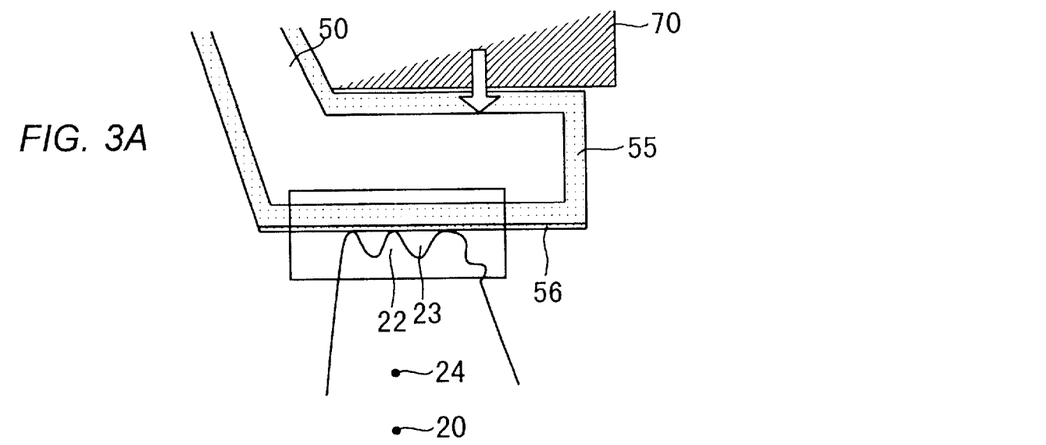
FIGS. 3A through 3C are cross-sectional views for describing contact operation between a contact terminal of a test socket and an external connection terminal of an electronic device.
Figure 3B:
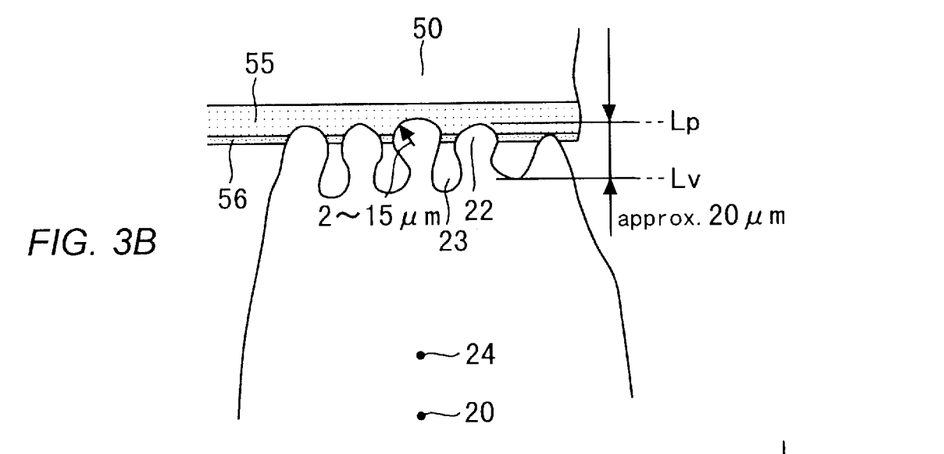
Figure 3C:
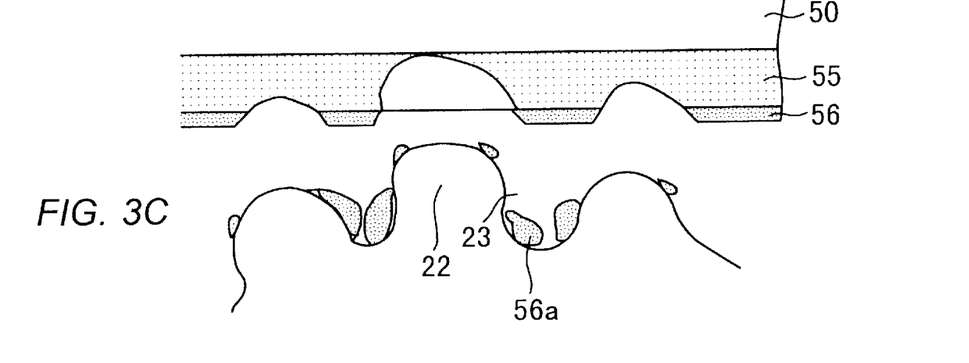

FIGS. 1, 2 and FIGS. 3A through 3C are descriptive views for describing the structure of a contact according to a first aspect of the present invention. FIG. 1 is a perspective view showing a contact terminal (contact) of a test socket to be brought into close contact with an external connection terminal of an IC; FIG. 2 is an enlarged side view showing contact between the contact terminal and the external connection terminal; and FIGS. 3A through 3C are cross-sectional views for describing a case where the electrical characteristics of an IC are measured and tested through use of the contact terminal.

As shown in FIG. 1, reference numeral 10 designates an IC whose electrical characteristics are to be measured; 50 designates an external connection terminal of the IC 10; 20 designates a contact terminal (contact or contact pin) of a test socket 60, which is as shown in FIG. 10; and 24 designates a contact projection provided in the vicinity of the tip end of the contact terminal 20. As in the case of the contact terminals shown in FIG. 10, the contact terminals 20 are arranged in a predetermined layout within a test socket 60.

As shown in FIGS. 2 and 3, reference 22 designates protrusions formed on the surface of the contact projection 24; and 23 designates recesses formed in the surface of the contact projection 24. Reference numeral 55 designates the outermost layer of the external connection terminal 50 (corresponding to a solder plating film in the first embodiment). Reference numeral 56 designates an oxide film formed on the surface of the outermost layer (solder plating film) 55 in a plane where the external connection terminal 50 contacts the contact terminal 20.

As shown in FIG. 2, the contact projection 24 is formed in the area of the contact terminal 20 to be brought into contact with the external connection terminal 50, so as to project from the base portion of the contact terminal 20. The tip end of the contact projection 24 is formed into a substantially spherical or cylindrical surface having a radius of curvature of 0.03 to 0.3 mm.

Particularly, during the course of testing the semiconductor package, pieces of foreign matter arise from a package per se; for example, burrs of mold resin constituting a package or fillers such as glass beads contained in the mold resin.

In the event that such pieces of foreign matter are caught between the contact terminal 20 and the external connection terminal 50, an electrical contact failure will arise, whereby a non-defective IC will be determined to be defective.

As a result of a measurement of the size distribution of the pieces of foreign matter, the pieces of foreign matter were found to measure about 10 to 100 microns. In the present embodiment, the tip end of the contact terminal 20 is sharpened to avoid catching these pieces of foreign matter.

From a test performed while the geometry of the contact projection 24 (i.e., the radius of curvature of the tip end) was changed, it is found that the probability of the tip end of the contact projection 24 catching the foreign matter becomes very low when the tip end of the projection 24 is formed into an R-shaped so as to assume a radius of curvature of 0.3 mm or less. The contact terminal 20 having the contact projection 24 is formed through wire-cut electric discharge and pressing. It was found that the tip end of the contact projection 24 can be formed in practice to assume a minimum radius of curvature of about 0.03 mm. Accordingly, the tip end of the contact projection 24 may preferably assume a radius of curvature of 0.03 mm to 0.3 mm.

In the present embodiment, on the tip end of the contact projection 24 or the area of the contact projection 24 which contacts the external connection terminal 50, a plurality of protuberances 22 and recesses 23 are formed from a smooth curved surface. Each of the recesses 23 is formed to have a bottle neck. Further, the radius of curvature of the top of the protuberance 22 is set approximately equal to the thickness of an outermost layer (solder plating layer) 55 formed on the surface of the external connection terminal 50; i.e., a thickness of about 10 microns. Further, the depth of the recesses 23 is set to be approximately equal to or more than the thickness of the outermost layer (solder plating layer) 55 formed on the surface of the external connection terminal 50; i.e., a thickness of about 10 microns. The deeper the recesses 23, the better.

Since the protuberances 22 and the recesses 23 constitute a substantially continuous curved surface, the projections are similar to villi projecting from the surface of the human stomach or intestines.

The projection 24 having such an irregular surface is formed as follows: First, by means of pressing, a plate material, such as beryllium or phosphor bronze, is formed into the shape of a contact terminal having a contact projection. The surface of the contact projection of the contact terminal is partially roughened by means of electric discharge, and the contact terminal is then plated with nickel. The nickel plating is grown to form a desired irregular surface.

No particular limitations are imposed on discharge machining conditions. It is found that, during electrical discharge, a metal constituting the material of the contact terminal is fused to metal particles whose diameter is on the order of several microns and that the metal particles again adhere to the surface of the material, thus constituting nuclei of protuberances. Further, it is found that during electric discharge, supply of water or kerosene for cooling the electrodes (i.e., the wire or die-sinking electrodes) at the highest possible rate at which the wire or die-sinking electrodes are not damaged is suitable for generating nuclei. In the present embodiment, the surface of the contact terminal is intentionally roughened through electric discharge, and the plating is grown, to thereby constitute an irregular surface.

Although, in the present embodiment, a portion of the contact terminal is formed through wire-cut discharge or die-sinking discharge, the entirety of the contact terminal may also be formed through; e.g., electric discharge.

The material of the contact terminal is plated with nickel by means of electrolytic plating. A plating fluid for forming a matting surface is employed, and the material is plated in the plating fluid at 3 A/cm² for 20 minutes. As a result, there are formed protuberances whose tip ends have a mean radius of curvature of about 10 microns (the radius of curvature varies from 5 to 15 microns). The radius of curvature of the minute protuberances can be changed by means of controlling the plating time.

Although FIG. 2 shows a single contact projection 24 projecting from the base of the contact terminal 20, a plurality of contact projection 24 may also be formed.

The protuberances 22 formed on the surface of the contact projection 24 may also assume, e.g., a cylindrical shape in place of a portion of the schematic spherical surface.

As mentioned previously, the member constituting the outermost layer 55 of the external connection terminal 50 is formed from solder and assumes a thickness of about 10 microns. The minute protuberances 22 of the contact terminal 20 that contact the external connection terminal 50 assume a surface roughness of about 0.1 to 0.5 microns or less.

In the present embodiment, as a result of the top of the protuberance 22 being formed so as to assume a radius of curvature of about 10 microns, the recess 23 is imparted with a depth of about 20 microns. As shown in FIG. 3B, the depth of the recess 23 is defined by an interval between the peak line Lp and the bottom line Lv.

In general, the radius of curvature of the top of the protuberance 22, which is approximately equal to the thickness of the outermost layer (solder plating layer) 55 of the external connection terminal 50, is set to about 2 to 15 microns, preferably 5 to 15 microns.

Although the present embodiment has been described by reference to an example of a contact terminal to be brought into contact with a solder plating layer, the contact terminal may also be used with a gold or silver electrode, so long as the contact terminal is formed from resiliently-deformable soft metal. Although lead terminals are described as an example of an external connection terminal of a semiconductor package, the foregoing minute protuberances 22 and the recesses 23 are also effective for use with solder-ball electrodes; e.g., BGA or CSP, so long as minute irregularities are formed in the surface of the tip end of the solder ball contact.

Effects of the minute irregularities on the measurement will now be described.

As shown in FIG. 1, the IC 10 is positioned opposite the contact terminals 20 of a test socket, as mentioned previously, and the external connection terminals 50 are pressed by means of a pressing tool 70 so as to come into contact with the contact terminals 20.

FIG. 2 shows one of the contact projections 24 formed in the vicinity of the tip ends of the contact terminals 20 when it is in close proximity to the external connection terminals 50. FIG. 3A shows the protuberances 22 of the contact projection 24 when they are in contact with the oxide film 56 of the external connection terminal 50, and FIG. 3B shows the protuberances 22 when they are engaged with the oxide film 56. FIG. 3C shows the oxide film 56, the outermost layer 55, and the external connection terminal 50 after the protuberances 22 have come into contact with the external connection terminal 50.

When the IC 10 situated in the position shown in FIG. 3A is pressed slightly, the protuberances 22 formed at the top of the contact projection 24 of the contact terminal 20 fracture the oxide film 56 of the external connection terminal 50 and engage with the outermost layer (solder plating) 55.

When the radius of curvature of the top of the protuberance 22 equals the thickness of the outermost layer 55, the largest contact area can be ensured. For this reason, the radius of curvature of the protuberance 22 is made equal to or less than the thickness of the outermost layer 55, thus establishing good electrical contact between the contact terminal 20 and the external contact terminal 50.

Since the need for effecting sufficient slippage between the contact terminal 20 and the external contact terminal 50, which has been required in the past, is negated, good, continuous electrical contact can be maintained without involvement of coagulation and deposition of solder.

As shown in FIG. 3C, when the protuberances 22 are engaged with the outermost solder layer 55, the areas of the solder and the oxide film 56 with which the protuberances 22 engage are displaced to the surroundings of the areas. The thus-displaced solder and the oxide coating are forced into the recesses 23 formed between the protuberances 22 and are collected in the recesses 23 as chips 56a.

If the contact terminal 20 does not have the protuberances 22, as in the case of the conventional contact terminal, the thus-displaced solder coagulates over the entire surface of the contact terminal, thus oxidizing the surface of the contact terminal. Further, in the case of the conventional contact terminal, the oxide film deposits to a greater thickness with an increase in the number of tests, thus hindering good electrical contact. In contrast, in the present embodiment, since a plurality of recesses 23 are formed in the top of the contact terminal 22, the solder and oxide film adhering to the contact terminal readily flow into the recesses 23, thus preventing deposition of the oxide film on the contact terminal.

Further, formation of a plurality of protuberances 22 in the top of the contact terminal 20 facilitates establishment of contact between the contact terminal 20 and the external connection terminal 50. Further, the surface roughness of the protuberances 22 is about 0.1 to 0.5 microns Ry or less. Therefore, solder is less likely to coagulate on the surface of the contact terminal 20. Further, even if solder coagulates on the surface of the contact terminal 20, the solder can be readily removed.

The protuberances and recesses are formed by roughening the material of the contact terminal to a surface roughness of about 5 to 30 microns by means of electric discharge, sand blasting, liquid honing, or etching. The surface of the thus-roughened material is plated. Plating grows on the protuberances in preference to plating on the recesses, thus enhancing the difference between the protuberances and the recesses. Accordingly, desired minute irregularities can be formed. Although, in the present embodiment, nickel is employed as plating material, other plating material, such as gold or chromium, may also be employed.

In the present first embodiment, any metal may be employed as the material of the base of the contact terminal 20, so long as the metal material can be deformed with high resiliency, as in the case of, for example, beryllium copper or phosphor bronze. The metal material is punched into a predetermined geometry by means of pressing. Only the area of the thus-punched material which may contact the IC 10 is subjected to electric-discharge machining. The thus-machined portion is plated with nickel to a thickness of 2 to 20 microns. Electric-discharge machining of the portion of the metal contributes to a reduction in machining costs.

The IC, whose electrical characteristics to be measured, described in this specification may designate any semiconductor product or a bare chip. The external connection terminals described in this specification may designate any leads, lands, pads, or bumps formed on an IC in order to connect the IC on a board. The contact terminal described in this specification may designate any leaf-shaped member, plane-shaped member, line-shaped member, or needle-shaped member.

In the present embodiment, the contact terminal can also be applied to a test in which the contact terminal is brought into contact with external connection terminals formed on an electronic device or component other than an IC; for example, a printed board or an LCD. Needless to say, the surface of the contact terminal having irregularities is effective for use in the tip end of a POGO pin used for testing a CSP or BGA package or a contact point of a so-called snap contact terminal.

As mentioned above, in the present embodiment, when the contact terminal is brought into contact with a substance of interest, plating material and an oxide film of the substance are displaced and collected into the recesses, thereby preventing the plating material and the oxide film from depositing on the protuberances that contact the substance.

Even if the recesses are filled with the plating material, the solder will flow to the adjacent recesses by means of propagation of contact pressure, thus enabling the tip ends of the protuberances to remain exposed on the surface of the contact terminal at all times.

Further, the contact terminal according to the present embodiment negates the need for relative slippage (ranging from 50 to 150 microns) between the surface of the contact terminal and the surface of the substance, which would otherwise be required by the conventional contact terminal. Stable electrical contact can be established by means of the minimum relative slippage (of 50 microns or less). Thus, stable electrical contact can be ensured over a long period of time without involvement of coagulation and deposition of solder plating material.

Further, stable electrical contact can be ensured with involvement of the minimum relative slippage and without involvement of relative slippage. Flaws to be formed in the external connection terminals of a substance to be measured can be made dramatically smaller than those formed in the external connection terminals by the conventional contact terminals. Specifically, the flaws will be formed in a few places, and will have a diameter of about 20 microns. Damage to plating, which would otherwise be ascribed to scratches made by the conventional contact terminal, is substantially eliminated. As a result, a highly-reliable test can be performed while stable electrical contact between the contact terminals and the external connection terminals is maintained, thereby preventing a decrease in the yield of packaging of semiconductor packages after the test.

Second Embodiment

Figure 4A:
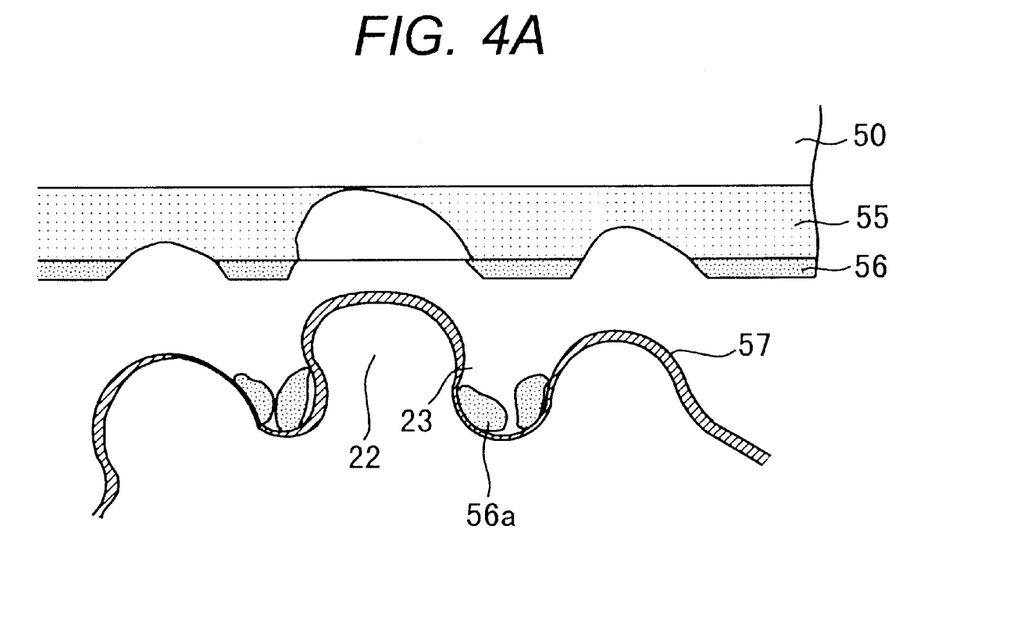
FIGS. 4A and 4B are illustrations for describing the structures of a contact terminal according to a second embodiment of the present invention.
Figure 4B:
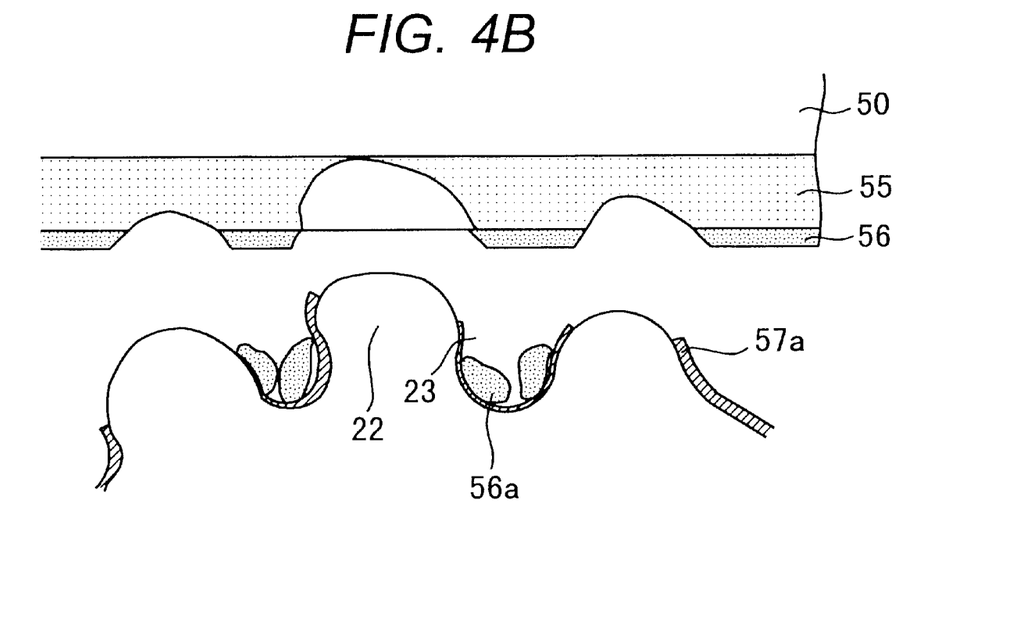

FIGS. 4A and 4B are illustrations for describing the structures of a contact terminal according to a second embodiment of the present invention.

Like the irregularities formed in the contact terminal 20 described in connection with the first embodiment, the minute protuberances 22 and the minute recesses 23 are formed in the surface of the tip end of the contact projection 24 projecting from the base portion of the contact terminal 20.

In the present embodiment, as shown in FIG. 4A, a conductive hard film 57 is formed on the surface of the irregularities.

The conductive hard film 57 may be of any type of material, such as a graphite-based material or a ceramics-based material. For example, there may be employed a diamond-like carbon (DLC) film containing a large amount of graphite components or a conductive DLC film doped with metal ions; e.g., tungsten metal ions. Alternatively, there may be employed an originally-conductive hard film, such as a TiN, CrN, or TiCN film.

Even after the protuberances 22 have come into contact with a member constituting the outermost layer 55 of the external connection terminal 50, the member of the outermost layer 55 is less likely to adhere to the protuberances 22.

As shown in FIGS. 4A and 4B, the graphite-based or ceramics-based hard film 57 has a low affinity for the member of the outermost layer 55, particularly solder plating, and chips of the member of the outermost layer 55 or the chips 56a of the oxide film do not adhere to the protuberances 22 but readily flow into the recesses 23 extending below the protuberances 22, thus maintaining the surface of the protuberances 22, which actually contacts the external connection terminal, in new condition over a long period of time.

In the case of the second embodiment, a graphite-based hard DLC film is grown over the surface of the minute irregularities, and the DLC film is doped with tungsten metal ions during the course of growth of the DLC film, whereby the DLC film becomes conductive. The tungsten metal ions used for doping account for a volume percentage of about 50%.

As shown in FIG. 4B, an insulating film 57a (a dielectric film) to which solder is much less likely to coagulate is formed on the surface of the minute irregularities, and the dielectric film 57a is removed from only the area of the tip end of the protuberance that establishes electrical contact with the external connection terminal 50.

In the case of the contact terminal 20 and the external connection terminal 50 shown in FIG. 4B, after the DLC film has been grown on the surface of the minute irregularities of nickel, the DLC film is removed from the tip ends of the protuberances 22 by means of exposing the surface of the irregularities in oxygen plasma.

As mentioned above, the second embodiment yields the same advantageous result as that yielded by the first embodiment. Further, the plating material becomes much less likely to deposit on the surface of the protuberances 22, thus further extending the life of the contact terminals.

Third Embodiment

Figure 5:
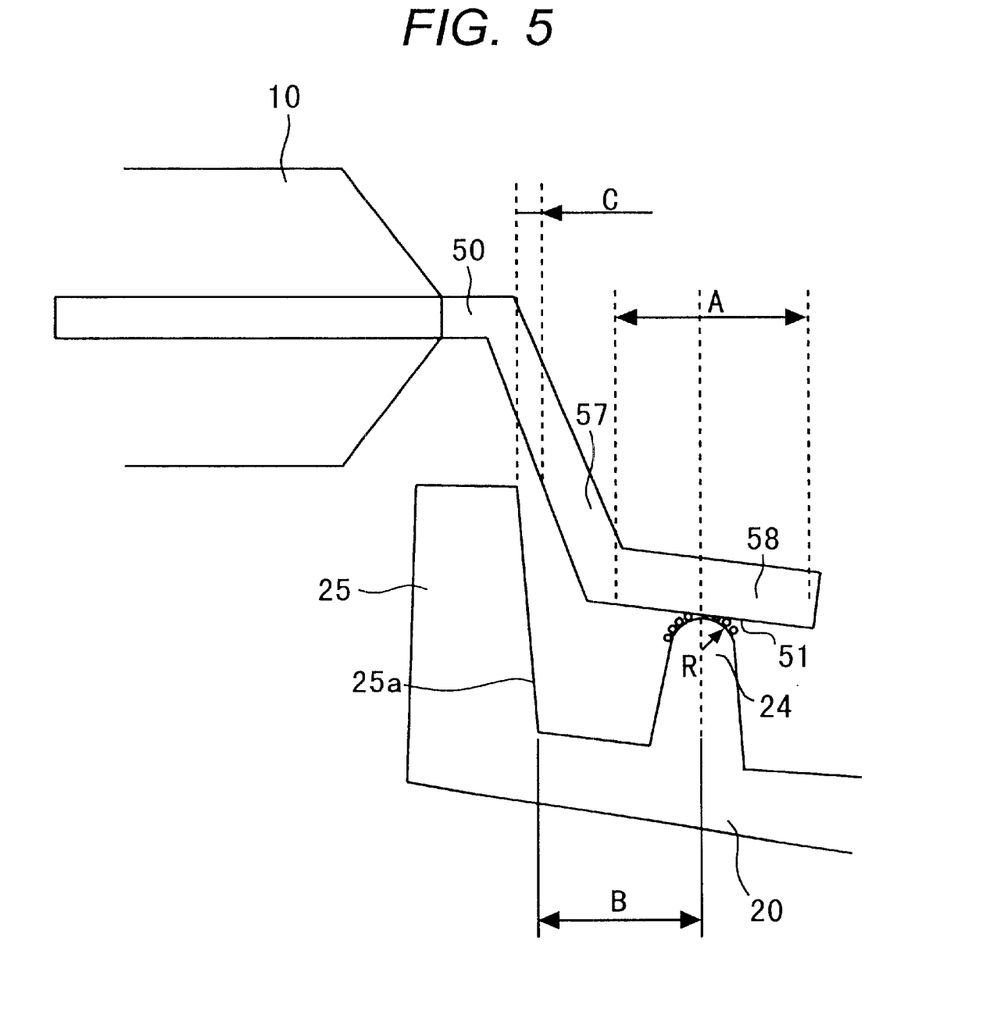
FIG. 5 is an illustration for describing the structure of a contact terminal according to a third embodiment of the present invention.

FIG. 5 is an illustration for describing the structure of a contact terminal according to a third embodiment of the present invention.

In FIG. 5, reference numeral 25 designates a guide projection which is formed at the outermost end of the contact terminal 20; namely, a position outward the position of the contact projection 24, and projects in the same direction as the contact projection 24 much further than the same.

The external connection terminal 50 of the IC 10 comprises a leg section 57 which extends substantially in parallel with the contact projection 24 or the guide projection 25; and a contact section 58 which is formed by bending the tip end of the leg section 27 at substantially right angles and extends in the direction perpendicular to the contact projection 24. The lower surface of the contact section 58 constitutes a contact plane 51 (of length A).

Distance B between the center of the contact projection 24 of the contact terminal 20 and an interior surface 25a of the guide projection 25 is set so as to become slightly longer than one-half the length AA of the contact plane 51.

In the case of normal contacting action, the tip end of the contact projection 24 of the contact terminal 20 comes into contact with the contact plane 51 in substantially the longitudinal center of the contact plane 51. At this time, the guide projection 25 forms a nominal clearance C with respect to the external connection terminal 50 and does not come into physical contact with the same.

If the relative position between the IC 10 and the contact terminal 20 deviates and the IC 10 deviates leftward in the drawing, the leg section 57 of the external connection terminal 50 comes into contact with the guide projection 25, thus preventing relative displacement. Accordingly, the contact plane 51 is prevented from coming out of contact with the contact projection 24.

If the relative position between the IC 10 and the contact terminal 20 deviates and the IC 10 deviates rightward in the drawing, the clearance C between the leg section 57 of the external connection terminal 50 and the guide projection 25 becomes wider. The positioning between the IC 10 and the contact terminal 20 is defined such that the clearance C becomes smaller than one-half the length A of the contact plane 51. As a result, the contact plane 51 is prevented from coming out of contact with the contact projection 24.

As mentioned above, in the present embodiment, the contact projection 24 (R=0.03 to 0.1 mm, preferably less than 0.3 mm) of the contact terminal 20 is brought into contact with the external connection terminal 50 of the IC 10. The guide projection 25 integrally formed with the contact terminal 20 is situated behind the external connection terminal 50. The clearance C between the leg section 57 of the external connection terminal 50 and the guide projection 25 is set to substantially one-half the width A of the contact surface 51 or less, thus preventing the contact point of the contact projection 24 from coming out of contact with the contact plane 51.

As a result, there can be maintained stable contact between the external connection terminal 50 of the IC 10 and the contact projection 24 of the contact terminal 20.

Fourth Embodiment

Figure 6:
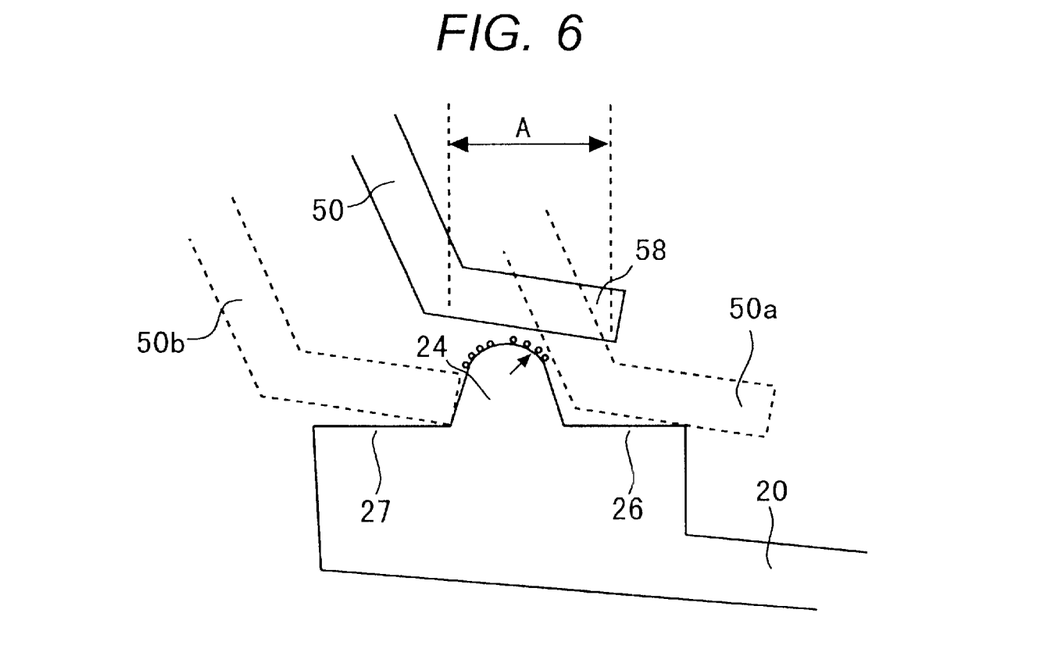
FIG. 6 is an illustration for describing an example of the structure of a contact terminal according to a fourth embodiment of the present invention.

FIG. 6 is an illustration for describing one example of the structure of a contact terminal according to a fourth embodiment of the present invention.

In FIG. 6, reference numerals 26 and 27 designate plane receiving sections formed to either side of the contact projection 24 at the foot thereof. More specifically, in the present embodiment, the plane receiving sections 26 and 27 are provided to either side of the contact projection 24 with respect to the direction in which the contact terminal 20 departs from or approaches the IC 10.

If, due to a positioning error, the IC 10 and the contact terminal 20 are displaced in a direction in which they mutually approach, the external connection terminal 50 may become dislodged from the contact projection 24, as indicated by a broken line 50a shown in FIG. 6. Even in this case, contact between the contact terminal 20 and the external connection terminal 50 is maintained by virtue of the plane receiving section 26.

If the IC 10 and the contact terminal 20 deviate in a direction in which they mutually depart from each other, the external connection terminal 50 may be dislodged from the contact projection 24, as indicated by a broken line 50b shown in FIG. 6. Even in this case, contact between the contact terminal 20 and the external connection terminal 50 is maintained by virtue of the plane receiving section 27.

As mentioned above, in the present embodiment, the contact terminal 20 has the contact projection 24 (R=0.03 to 0.1 mm, preferably less than 0.3 mm), and the plane receiving sections 26 and 27 are formed at positions below the contact projection 24. Even if the contact plane 51 of the external connection terminal 50 is dislodged from the contact projection 24 due to poor accuracy of the IC 10, positioning errors, or the poor accuracy of a contact position, either the plane receiving section 26 or the plane receiving section 27 receives the external connection terminal 50. Therefore, the external connection terminal 50 comes into contact with either the plane receiving section 26 or the plane receiving section 27 without involvement of fall of the IC 10, thus ensuring contact between the contact terminal 20 and the IC 10.

In some cases, if the external connection terminal 50 is received by the plane receiving section 27, as indicated by a broken line 50b shown in FIG. 6, the external connection terminal 50 may engage the step between the plane receiving section 27 and the contact projection 24, thus making it difficult to remove the IC 10 from the contact terminal 20.

Figure 7:
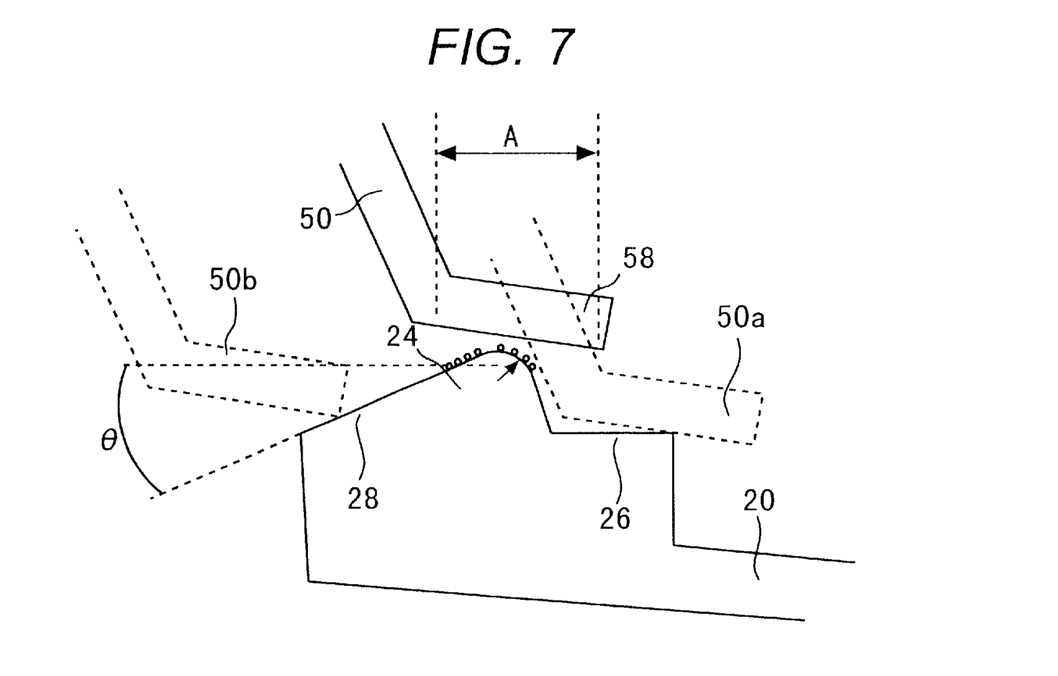
FIG. 7 is an illustration for describing another example of the contact terminal according to the fourth embodiment.

FIG. 7 is an illustration for describing another example of the contact terminal according to the fourth embodiment which solves such a problem.

In FIG. 7, reference numeral 28 designates a tapered receiving section formed so as to taper down toward the tip end of the contact terminal 20.

In a case where the tapered receiving section 28 is formed in this way, if the IC 10 and the contact terminal 20 deviate so as to depart from each other, the external connection terminal 50 is dislodged while being gradually slid over the tapered receiving section 28 from the contact projection 24, as indicated by a broken line 50b shown in FIG. 7. As a result, engagement of the external connection terminal 50 such as that described in connection with FIG. 6 can be prevented. Further, even in this case, contact between the contact terminal 20 and the IC 10 can be maintained by virtue of the tapered receiving section 28.

Figure 8:
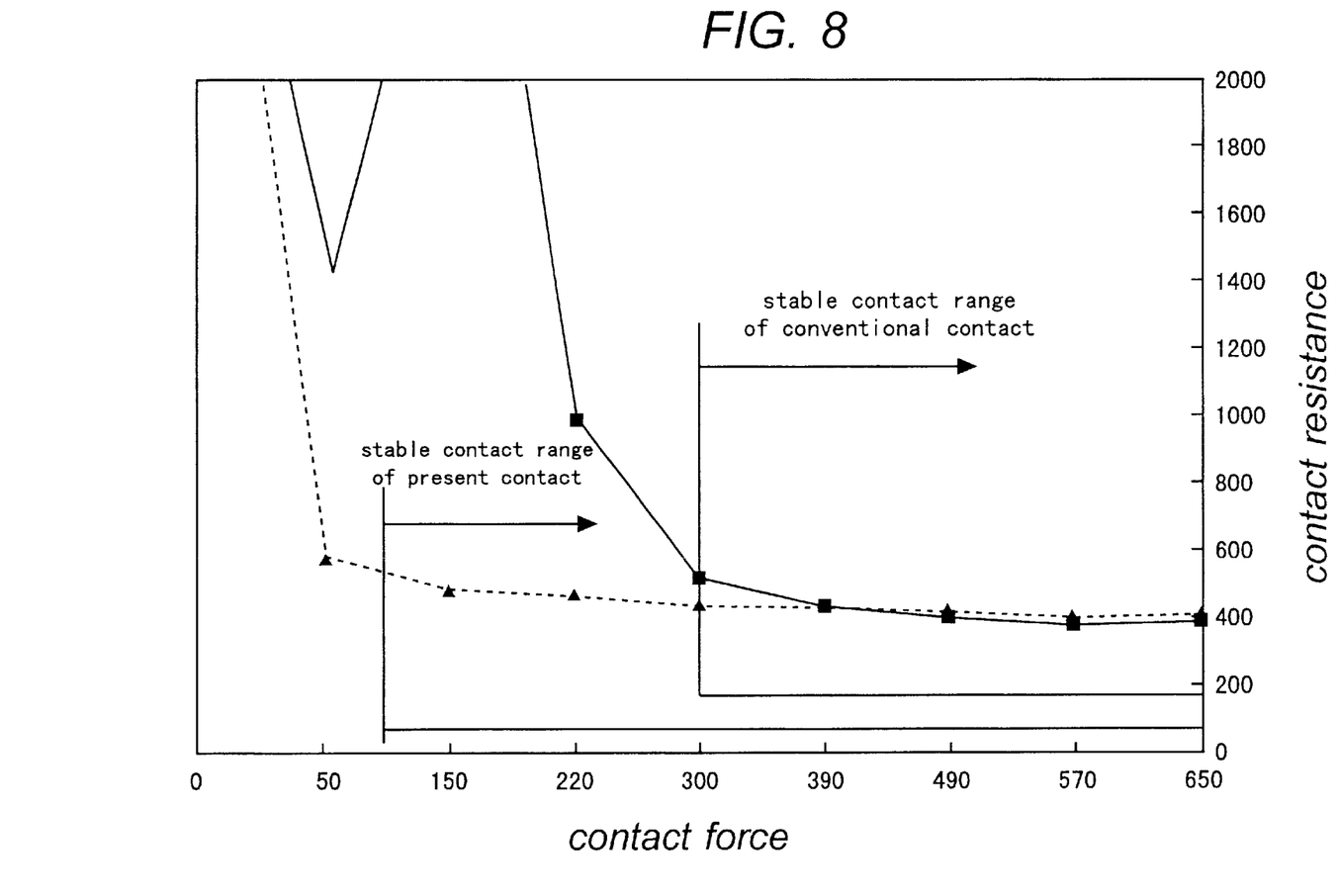
FIG. 8 show data for explaining the stability of contact between an electronic device and the contact terminals of a test socket according to the present invention.
Figure 9:
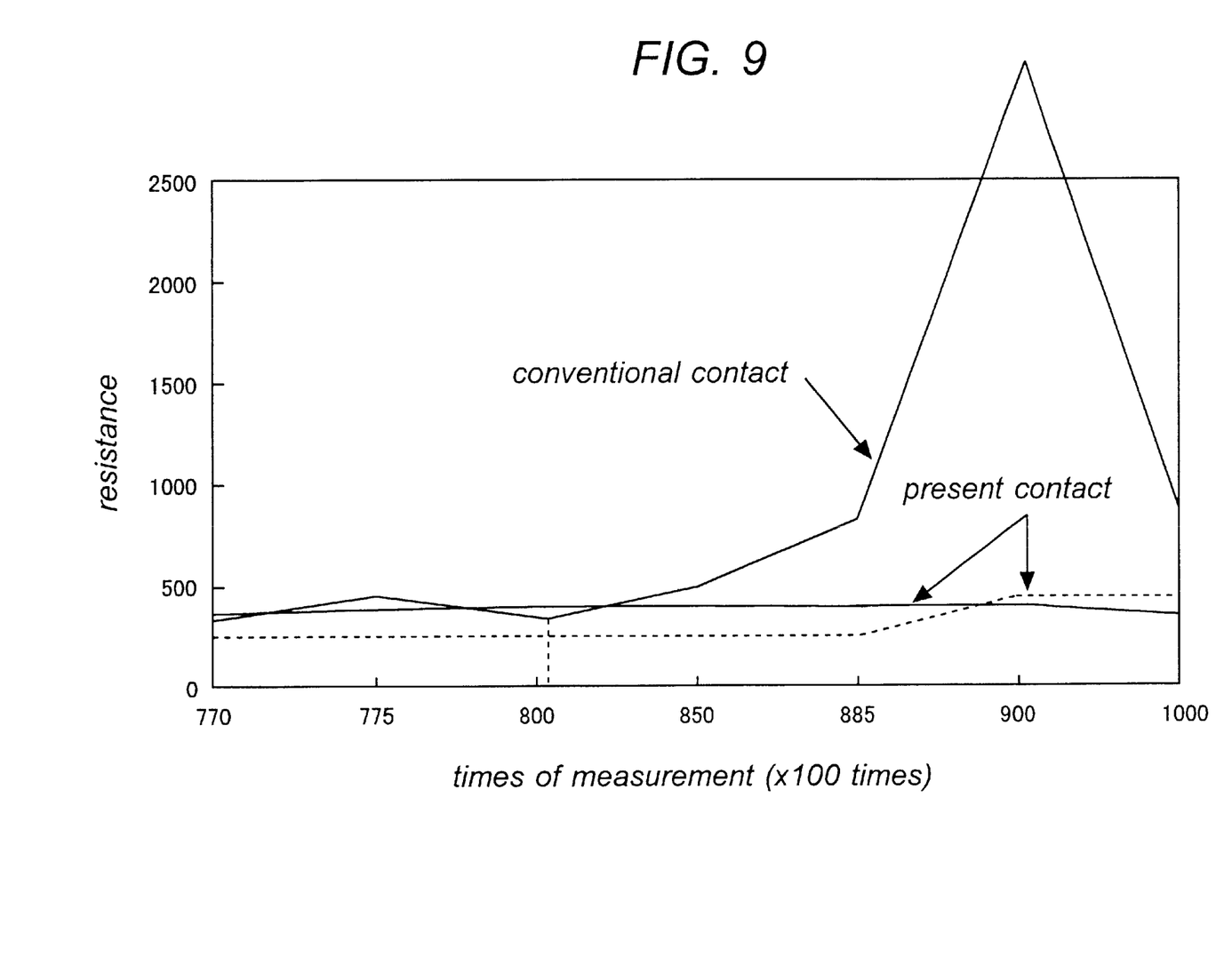
FIG. 9 shows data for explaining continuity of stable contact between an electronic device and the contact terminals of a test socket according to the present invention.

FIGS. 8 and 9 are illustrations for describing the advantageous effect of the present invention, such as those described in connection with each of the above embodiments.

FIG. 8 shows data which shows the stability of contact between an IC and the contact terminals of a test socket according to the present invention. As shown in FIG. 8, in order to ensure stable contact, conventional contact terminals require a contact force of a certain magnitude or more (a contact force of 300 or more shown in FIG. 8). In contrast, the contact terminals according to the present invention can ensure stable contact by receipt of only a contact force corresponding to a fraction of the foregoing contact force (a contact force of 100 or more shown in FIG. 8).

FIG. 9 shows data which shows continuity of stable contact between an IC and the contact terminals of the test socket according to the present invention. As shown in FIG. 9, after the conventional contact terminals have been used for measurement more than about 80,000 times, the contact resistance of the conventional contact terminals starts increasing, thus impairing stable contact. In contrast, even after the contact terminals according to the present invention have been used for measurement more than 100,000 times, the contact resistance of the contact terminals does not increase, thus maintaining stable contact.

The present invention, which can be embodied in the manner as mentioned in each of the above embodiments, yields the following advantageous results.

According to the first aspect of the present invention, the socket for use in testing an electronic device or a semiconductor package comprises contact terminals which are brought into electrical contact with external connection terminals of the electronic device or semiconductor package. In each of the contact terminals, a plurality of protuberances are formed from smooth curved surfaces in the portion of the contact terminals which contacts the corresponding external connection terminal. A plurality of recesses are formed from smooth, curved surfaces so as to become adjacent to the respective protuberances. Villi-like structure constituted by alternate arrangement of the protuberances and the recesses contacts the surface of the external contact terminal. Each of the villi-like structure causes minute elastic deformation at the point of contact the external connection terminal, thus enlarging the contact area and realizing stable electric contact.

Preferably, the plurality of protuberances are formed to assume substantially spherical surfaces having a radius of curvature of 2 to 15 microns. When the protuberances come into contact with the metal provided on the surface of the external connection terminal (e.g., a solder plating layer) and deform the metal, the area of the metal to be deformed can be extended to substantially the maximum value, by means of setting the radius of curvature of the protuberances to the thickness of the metal; that is, 2 to 15 microns.

Preferably, the plurality of protuberances and recesses are coated with a conductive hard film. As a result, the hard film prevents coagulation, which would otherwise be caused when the external connection terminal comes into contact with the surface of the contact terminal.

According to the second aspect of the present invention, the socket for use in testing an electronic device or a semiconductor package comprises one or more contact projections which are provided on the surface of each of the contact terminals and contact external connection terminals of the electronic device or semiconductor package. The tip end of each of the contact projections is formed to assume a substantially spherical surface having a radius of curvature of 0.03 to 0.3 mm. The plurality of protuberances and recesses are formed on the surface of the tip end of each of the contact projections. Accordingly, the probability of foreign matter being caught between the external connection terminal and the surface of the contact terminal is reduced.

According to the third aspect of the present invention, the socket for use in testing an electronic device or a semiconductor package comprises a contact projection which contacts external connection terminals of the electronic device or the semiconductor package. Further, a guide projection is provided which is spaced a predetermined distance apart from the contact projection, and is located at the outermost tip end of each of the connection terminals, and extends further than the contact projection in the same direction in which the contact projection protrudes. Thus, positioning between the external connection terminals and the contact terminals can be controlled.

Preferably, plane receiving sections are provided to either side of the contact projection, or a tapered plane is formed so as to gradually taper from the tip end of the contact projection. Thus, even if the positions of the contact terminals that contact the corresponding external connection terminals are displaced, electrical contact can be established between the contact terminals and the external connection terminals.

After the portion of each of the contact terminal which contacts the corresponding external connection terminal of the electronic device or the semiconductor package has been machined to a desired surface roughness through electric-discharge machining, the thus-roughened portion is plated with electrolytic nickel, and the thus-plated portion is further plated with gold. As a result, the irregularities described previously can be efficiently formed in the surface of the contact terminal.

An electronic device or a semiconductor package is obtained which is tested through use of one of the sockets mentioned as set forth. Thus, damage to the surface of the external connection terminals, which would otherwise be caused when the contact terminals contact the corresponding external connection terminals, can be reduced.

As mentioned above, the present invention ensures stable contact between the external connection terminals and the contact terminals and maintains continuous, stable contact.

Obviously many modifications and variations of the present invention are possible in the light of the above teachings. It is therefore to be understood that within the scope of the appended claims the invention may by practiced otherwise than as specifically described.

The entire disclosure of a Japanese Patent Application No. 11-173421, filed on Jun. 18, 1999 including specification, claims, drawings and summary, on which the convention priority of the present application is based, are incorporated herein by reference in its entirety.

What is claimed is:

1. A test socket, comprising:

contact terminals which are brought into electrical contact with external connection terminals of an electronic device or a semiconductor package, each of said contact terminals having a plurality protuberances and a plurality of recesses, said plurality of protuberances being formed from smooth curved surfaces in the portion to contact the external connection terminal of the electronic device, and said plurality of recesses being from smooth curved surfaces adjacent to said respective protuberances, wherein said plurality of protuberances are formed to assume substantially spherical surfaces having a radius of curvature of 2 to 15 microns.

2. The test socket according to claim 1, wherein said plurality of protuberances and recesses are coated with a conductive hard film.

3. A method of forming contact terminals of the test socket according to claim 1, the method comprising the steps of:

machining, to a desired surface roughness, the portion of each contact terminal which contacts an external connection terminal of the electronic device or the semiconductor package, through electric-discharge machining;

plating the thus-roughened portion with electrolytic nickel; and further plating the thus-plated portion with gold.

4. An electronic device or a semiconductor package whose electrical characteristics are tested through use of the test socket according to claim 1.

5. A test socket, comprising:

a plurality of contact terminals, each of said contact terminals including one or more contact projections provided on a surface thereof for contacting the external connection terminals of an electronic device or semiconductor package, a tip end of each of said contact projections being formed to assume a substantially spherical surface having a radius of curvature of 0.03 to 0.3 mm, each of said contact projections having a plurality of minute protuberances and a plurality of minute recesses provided on said substantially spherical surface thereof formed from smooth curved surfaces, wherein said plurality of protuberances are formed to assume substantially spherical surfaces having a radius of curvature of 2 to 15 microns.

6. The test socket according to claim 5, wherein said plurality of protuberances and recesses are coated with a conductive hard film.

7. The test socket according to claims 5, wherein each of said contact terminals further includes a guide projection formed a predetermined distance apart from said contact projection at the outermost tip end thereof and extending further than said contact projection in the same direction in which said contact projection protrudes.

8. The test socket according to claim 5, wherein each of said contact terminals further includes plane receiving sections provided on either side of said contact projection at the foot of, or a tapered receiving section formed so as to gradually taper from the tip end of said contact projection.

* * * * *